United States Patent
He et al.

(10) Patent No.: US 11,871,518 B1
(45) Date of Patent: Jan. 9, 2024

(54) BACKLIGHT MODULE AND DISPLAY DEVICE

(71) Applicant: HKC CORPORATION LIMITED, Shenzhen (CN)

(72) Inventors: Jiang He, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/211,524

(22) Filed: Jun. 19, 2023

(51) Int. Cl.
H05K 7/14 (2006.01)
H05K 7/12 (2006.01)
H05K 1/18 (2006.01)
H05K 7/18 (2006.01)

(52) U.S. Cl.
CPC ............ H05K 1/181 (2013.01); H05K 7/12 (2013.01); H05K 7/1418 (2013.01); H05K 7/18 (2013.01); H05K 2201/10128 (2013.01)

(58) Field of Classification Search
CPC ........ H05K 1/181; H05K 7/12; H05K 7/1418; H05K 7/18; H05K 2201/10128
See application file for complete search history.

(56) References Cited

U.S. PATENT DOCUMENTS

| | | | |
|---|---|---|---|
| 11,480,828 B1 * | 10/2022 | Wang | G02F 1/133603 |
| 2011/0058118 A1 | 3/2011 | Kim | |
| 2011/0110110 A1 | 5/2011 | Huang et al. | |
| 2014/0293695 A1 | 10/2014 | May | |
| 2019/0163021 A1 | 5/2019 | Jung et al. | |
| 2020/0113078 A1 * | 4/2020 | Kim | H05K 5/03 |
| 2020/0341333 A1 * | 10/2020 | Qiu | F21V 31/005 |
| 2022/0003388 A1 * | 1/2022 | Liu | F21V 19/005 |

FOREIGN PATENT DOCUMENTS

| | | |
|---|---|---|
| CN | 106842706 A | 6/2017 |
| CN | 109523925 A | 3/2019 |
| CN | 208568524 U | 3/2019 |
| CN | 110133914 A | 8/2019 |
| CN | 221266779 U | 4/2020 |
| CN | 212005217 U | 11/2020 |
| CN | 112767849 A | 5/2021 |
| CN | 112863890 A | 5/2021 |
| CN | 114203058 A | 3/2022 |
| CN | 114488621 A | 5/2022 |
| CN | 114677917 A | 6/2022 |
| CN | 216697683 U | 6/2022 |
| CN | 114740653 A | 7/2022 |

(Continued)

*Primary Examiner* — Sherman Ng (57) ABSTRACT

A backlight module and a display device is disclosed. The backlight module includes a backplate, a light board framework, and assembled light board arranged in sequence. The assembled light board include multiple light boards with a seam formed between adjacent light boards. The light board framework is arranged on the backplate and includes a main body defining multiple mounting grooves provided in a number equal to the number of the light boards in the assembled light board. Each of the light boards is installed in one of the mounting grooves. A supplementary light-emitting diode (LED) is disposed between adjacent mounting grooves to supplement light for the seam between every two adjacent ones of the light boards.

11 Claims, 4 Drawing Sheets

(56) References Cited

FOREIGN PATENT DOCUMENTS

| | | | |
|---|---|---|---|
| CN | 114822242 | A | 7/2022 |
| CN | 216901246 | U | 7/2022 |
| JP | 2003203511 | A | 7/2003 |
| JP | 2011054343 | A | 3/2011 |
| KR | 19990036987 | A | 5/1999 |
| KR | 20090090030 | A | 8/2009 |
| KR | 20100024324 | A | 3/2010 |
| TW | 200613831 | A | 5/2006 |
| WO | 2017156766 | A1 | 9/2017 |
| WO | 2017101227 | A4 | 10/2017 |
| WO | 2021104445 | A1 | 8/2021 |
| WO | 2022134396 | A1 | 6/2022 |

* cited by examiner

BACKLIGHT MODULE AND DISPLAY DEVICE

CROSS-REFERENCE TO RELATED APPLICATIONS

This application claims the priority and benefit of Chinese patent application 2022110925639, titled "Backlight Module and Display Device" and filed Sep. 8, 2022 with China National Intellectual Property Administration, the entire contents of which are incorporated herein by reference.

TECHNICAL FIELD

The present application relates to the field of display technology, and more particularly relates to a backlight module and a display device.

BACKGROUND

Since the Mini LED (Mini light-emitting diode) light board is limited by processing technology, yield, deformation and other factors, it cannot be made too large-sized. Therefore, large-size display screens are mostly assembled by multiple small Min LED light boards.

Therefore, how to fix the light boards to the backplate and how to prevent dark lines from appearing between corresponding adjacent light boards when the display device is displaying images have become urgent problems to be solved.

SUMMARY

In view of the above, it is one purpose of the present application to provide a backlight module and a display device, whereby when the light board is assembled, no positioning is required, so the assembly is more convenient, and the display device does not have dark lines.

The application discloses a backlight module. The backlight module includes a backplate, a light board framework, and an assembled light board arranged in sequence. The assembled light board includes a plurality of light boards, and a seam is formed between two adjacent light boards. The light board framework is used to be arranged on the backplate. The light board framework includes: a framework main body, where a plurality of mounting grooves are defined in the framework main body, the number of the mounting grooves is consistent with the number of the light boards in the assembled light board, and the light boards are arranged in the mounting grooves one by one; and light supplement light beads, where the light supplement light beads are located between the adjacent mounting grooves, and are used for light supplementation for the seam between the adjacent light boards.

In some embodiments, the light board framework includes a bottom plate, a plurality of frame portions, and a plurality of branch portions. The plurality of the frame portions and the plurality of the branch portions are arranged on the bottom plate. The plurality of frame portions are connected end to end to form a rectangular area. The branch portions are arranged in the rectangular area, and the plurality of the branch portions are intersecting horizontally and vertically to form a plurality of the mounting grooves distributed in a network. The light supplementation beads are arranged on the branch portions. The bottom plate is used to abut against the bottom surface of the light board, and the branch portions and the frame portions are respectively used to abut against the side surfaces of the light board.

In some embodiments, a sunken groove is set in the branch portions. The light supplementation beads are arranged on the bottom surface of the sink tank. The groove wall of the recessed groove is inclined, and the angle formed with the tank bottom of the recessed groove is an obtuse angle.

In some embodiments, the light board framework is made of an elastic material.

In some embodiments, the light board framework also includes a support post. The backlight module also includes the optical film, the support post is arranged on the branch portion, and is located between two adjacent light supplementation beads, and the optical film is arranged on a side of the support post away from the branch portion.

In some embodiments, the light board framework includes a bottom plate and a plurality of light bead seats. The light bead seats are arranged on the bottom plate, and the plurality of the light bead seats are arranged in strips to form a plurality of limit bands. The plurality of the limiting strips are intersecting horizontally and vertically to form a plurality of the mounting grooves distributed in a network. The edge of the light board is provided with a clamping groove corresponding to the position of the light bead seat. The light supplementation bead is arranged on the light bead seat. The light boards are arranged on the bottom plate, and the clamping groove of the light board is engaged with the light bead seat.

In some embodiments, the bottom of the mounting groove is provided with heat dissipation holes, and the area of the heat dissipation holes is smaller than the area of the bottom of the mounting groove. The position of the light board corresponding to the heat dissipation hole is provided with thermally conductive adhesive, and the thermally conductive adhesive is bonded to the backplate and the light board.

In some embodiments, a first contact is provided on the bottom plate, and the first contact is electrically connected to the adjacent fill light bead. A second contact is provided at a position corresponding to the first contact on the back of the light board, and the second contact is electrically connected to the same driver as the light beads on the light board.

In some embodiments, the shape of the clamping groove of the light board matches the shape of the light bead seat. The light bead seat includes a first seat and a second seat. The first seat is located at the intersection of the two interlaced limiting bands, and the four corners of the first seat are respectively provided with notches, forming a cross-shaped structure. The corner of the light board corresponds to the notch of the first seat. The second seat corresponds to the side of the light board, and the shape of the second seat is rectangular.

The present application further discloses a display device, which includes a display panel and the above-mentioned backlight module. The backlight module is arranged opposite to the display panel to provide a light source for the display panel.

Compared with the solution of directly fixing the light boards to the backplate, the solution of the present application does not need to position the light boards when multiple light boards are attached to the backplate, and the plurality of light boards can be directly arranged in the mounting grooves in one-to-one correspondence, leading to higher assembly efficiency and less chance of rework. Furthermore, by arranging the light supplementation bead between two adjacent mounting grooves, it can solve the problem of dark lines corresponding to the seams between two adjacent light boards when the display device is in operation.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

In the drawings: 10. Display device; 20. Display panel; 30. Backlight module; 310. Optical film; 320. Backplate; 321. Framework sunken groove; 330. Assembled light board; 331. Light board; 332. Clamping groove; 400. Light board framework; 410. Mounting groove; 411. Bottom plate; 412. Frame portion; 413. branch portion; 420. Recessed groove; 421. Groove wall; 430. Heat dissipation hole; 440. Support post; 510. First contact; 600. Light supplementation bead; 620. First base; 630. Second base.

DETAILED DESCRIPTION OF EMBODIMENTS

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple", "a plurality of", and the like mean two or more. Term "comprising", "including", and any variants thereof mean non-exclusive inclusion, so that one or more other features, integers, steps, operations, units, components, and/or combinations thereof may be present or added.

In addition, terms "center", "transverse", "up", "down", "left", "right", "vertical", "horizontal", "top", "bottom", "inside", "outside", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure.

Furthermore, as used herein, terms "installed on", "mounted on", "connected to", "coupled to", "connected with", and "coupled with" should be understood in a broad sense unless otherwise specified and defined. For example, they may indicate a fixed connection, a detachable connection, or an integral connection. They may denote a mechanical connection, or an electrical connection. They may denote a direct connection, a connection through an intermediate, or an internal connection between two elements. For those of ordinary skill in the art, the specific meanings of the above terms as used in the present application can be understood depending on specific contexts.

Hereinafter this application will be described in further detail with reference to the accompanying drawings and some optional embodiments.

Figure 1:
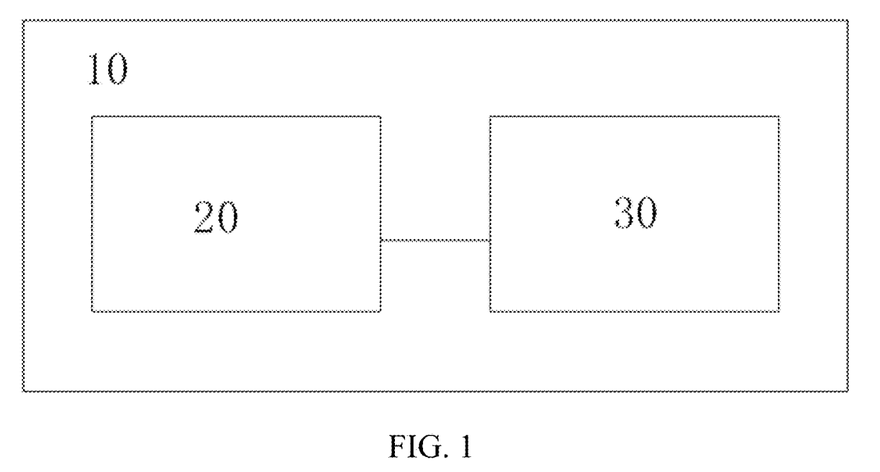
FIG. 1 is a schematic diagram of a display device according to an embodiment of the present application.

FIG. 1 is a schematic diagram of a display device according to an embodiment of the present application. As shown in FIG. 1, a display device 10 is disclosed. The display device 10 includes a display panel 20 and a backlight module 30. The backlight module 30 is disposed opposite to the display panel 20 and provides a light source for the display panel 20.

The display panel 20 includes, for example, a TN (Twisted Nematic) display panel, an IPS (In-Plane Switching) display panel, a VA (Vertical Alignment) display panel, and an MVA (Multi-Domain Vertical Alignment) display panel.

Figure 2:
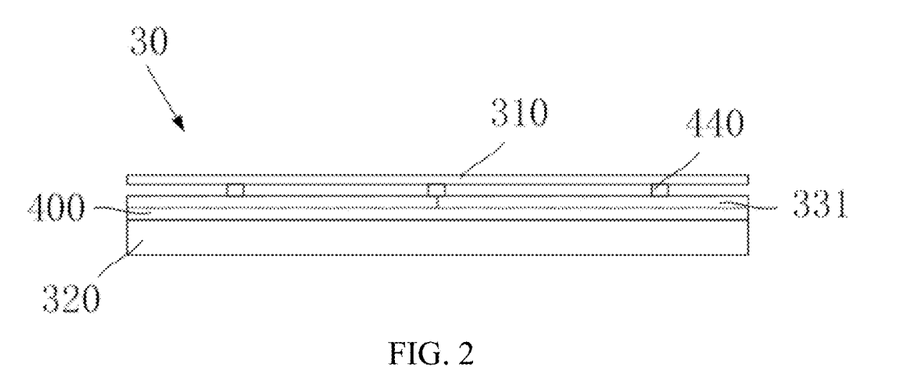
FIG. 2 is a schematic cross-sectional view of a backlight module according to an embodiment of the present application.

The present application further discloses a backlight module 30, which is used in the above-mentioned display device 10. For the backlight module 30, the present application provides the following design:

As shown in FIG. 2, the backlight module 30 includes a backplate 320, a light board framework 400, an assembled light board 330 and an optical film 310.

The light board framework 400 is disposed between the backplate 320 and the assembled light board 330, and the assembled light board 330 is fixed to the backplate 320 through the light board framework 400. The optical film 310 is disposed on a side of the splicing light board 330 away from the backplate 320.

Figure 3:
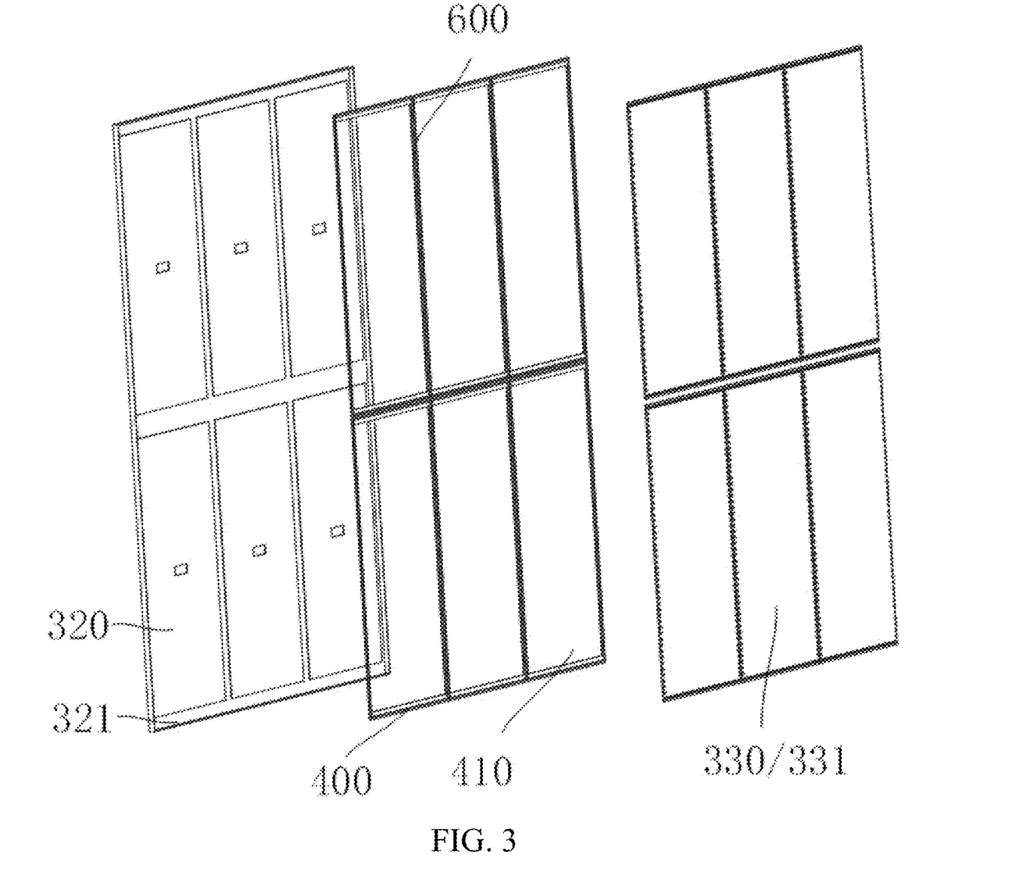
FIG. 3 is a schematic exploded view of a backlight module according to an embodiment of the present application.

As shown in FIG. 2 and FIG. 3, the light board framework 400 is arranged on the backplate 320. The light board framework 400 includes: a framework main body, and a plurality of mounting grooves 410 are defined in the framework main body, where the number of the mounting grooves 410 is consistent with the number of the light boards 331 in the assembled light board 330, and the light boards 331 are arranged in the mounting grooves 410 one by one; light supplementation beads 600, where the light supplementation bead 600 are located between the adjacent mounting grooves 410, and fill the seam between the adjacent light boards 331.

The light boards 331 can be fixed in the mounting grooves 410 by gluing, and the light board framework 400 can also be fixed to the back plate 320 by glue or screws. The number of mounting grooves 410 can be two or more, it is only necessary to ensure that the number of mounting grooves 410 corresponds to the number of light boards 331, which is not limited here.

Compared with the solution of directly fixing the light boards 331 to the backplate 320, the solution of the present application does not need to position the light boards 331 when multiple light boards 331 are attached to the backplate 320, and the plurality of light boards 331 can be directly arranged in the mounting grooves 410 in one-to-one correspondence, leading to higher assembly efficiency and less chance of rework. Furthermore, by arranging the light supplementation bead 600 between two adjacent mounting grooves 410, it can solve the problem of dark lines corresponding to the seams between two adjacent light boards 331 when the display device 10 is in operation.

Two specific embodiments of the backlight module 30 are listed below:

Embodiment 1

Figure 4:
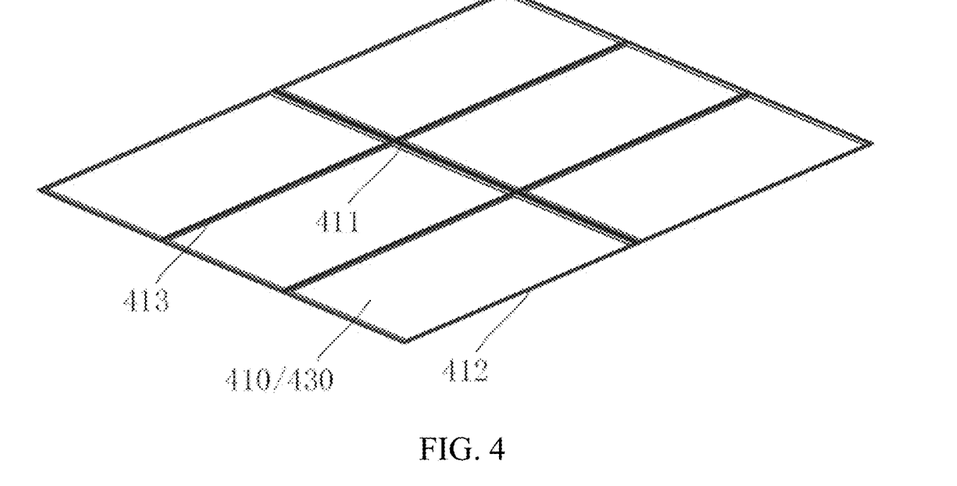
FIG. 4 is a schematic diagram of a backlight module according to a first embodiment of the present application.
Figure 5:
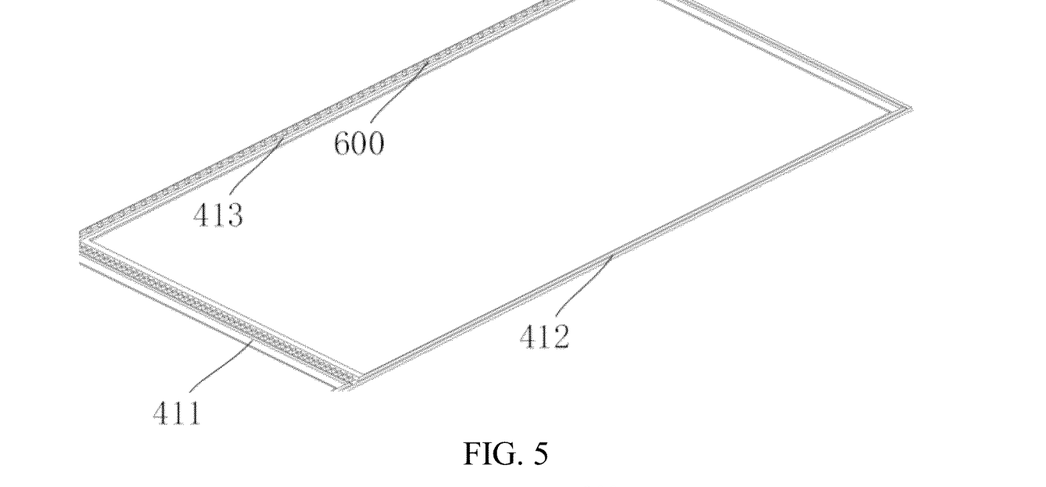
FIG. 5 is a partially enlarged schematic view of FIG. 4 of the present application.

FIG. 4 is a schematic diagram of a backlight module according to the first embodiment of the present application, and FIG. 5 is a partial enlarged view of FIG. 4 of the present application. As shown in FIG. 4 and FIG. 5, the light board framework 400 in the backlight module 30 includes a bottom plate 411, a plurality of frame portions 412, and a plurality of branch portions 413. The bottom plate 411, the plurality of frame portions 412 and the plurality of branch portions 413 are integrally formed.

The plurality of frame portions 412 and the plurality of branch portions 413 are arranged on the bottom plate 411, and the plurality of frame portions 412 are connected end to end to form a rectangular area. The branch portions 413 are arranged in the rectangular area, and the plurality of the branch portions 413 are interlaced horizontally and vertically to form the plurality of the mounting grooves 410 distributed in a network. The light supplementation beads 600 are disposed on the branch portions 413.

The bottom plate 411 abuts against the bottom surface of the light board 331, and the branch portions 413 and the frame portions 412 respectively abut against the side surfaces of the light boards 331.

The mounting groove 410 in this embodiment supports the bottom surface of the light board 331 through the bottom plate 411, thus limiting the position of the light board 331 in the vertical direction, so that the light board 331 can be pre-set on the framework, which is more convenient for assembly.

Moreover, in this embodiment, the frame portion 412 and the branch portion 413 limit the light board 331 in the horizontal direction, so that the edges of the light board 331 only contact the frame portion 412 and the branch portion 413 of the light board framework 400, effectively preventing the situation where when the light board 331 is used for a long time, the light board 331 continues to heat up, and when the viscosity of the glue between the light board 331 and the light board framework 400 becomes poor, the light board 331 is displaced, causing adjacent light board frameworks 400 to squeeze each other.

Figure 6:
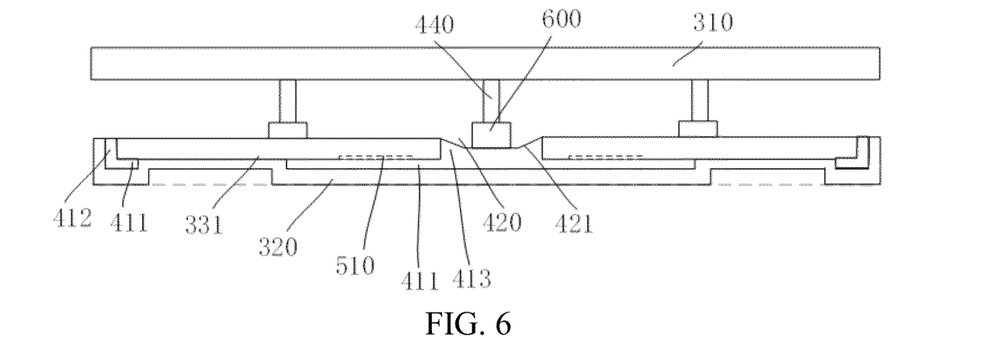
FIG. 6 is a schematic cross-sectional view of the backlight module according to the first embodiment of the present application.
Figure 7:
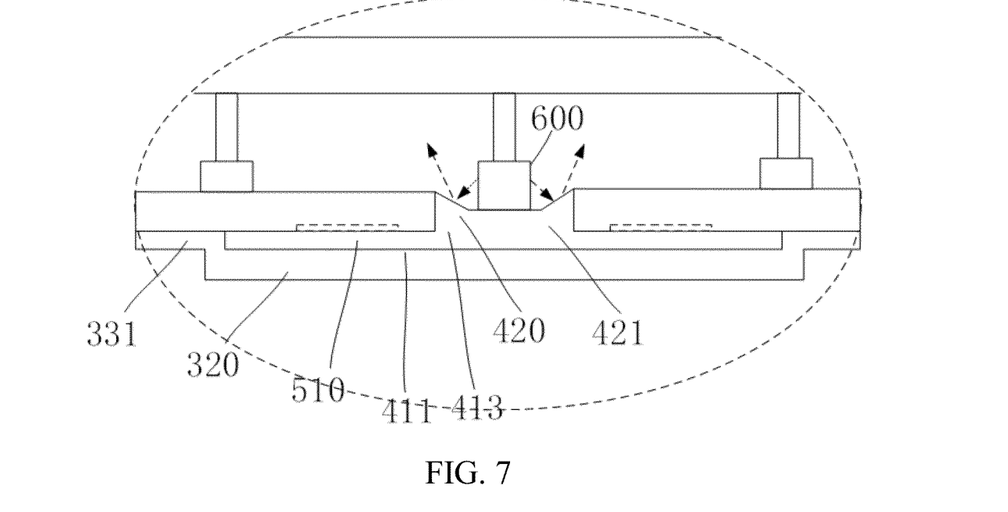
FIG. 7 is a partially enlarged schematic view of FIG. 6 of the present application.

As shown in FIGS. 6 and 7, in this embodiment, a sunken groove 420 is provided in the branch portion 413, and the light supplementation beads 600 are arranged on the bottom surface of the sunken groove 420. The sunken groove 420 is strip-shaped, and the length of the sunken groove 420 is equal to the length of the branch portion 413, and the light supplementation beads 600 are arranged equidistantly at the bottom of the sunken groove 420.

The groove wall 421 of the sunken groove 420 is inclined, and the angle formed with the bottom of the sunken groove 420 is an obtuse angle. To put it simply, in this embodiment, the inclined groove wall 421 reflects the light emitted by the light supplementation beads 600, thereby improving the utilization rate of light.

The depth of the sunken groove 420 may be smaller than the height of the branch portion 413, or may be equal to the height of the branch portion 413. When the depth of the sunken groove 420 is equal to the height of the branch portion 413, it is equivalent to setting the light supplementation beads 600 directly on the bottom plate 411.

The light emitting surface of the light supplementation beads 600 and the light emitting surface of the light beads on the light board 331 lie on the same horizontal plane, so that the light supplementation bead 600 and the light bead on the light board 331 are equidistant from the optical film 310, so that the uniformity of brightness can be ensured.

Further, the framework main body of the light board framework 400 is made of an elastic material, and the elastic material includes rubber material.

When the light board 331 is in use, if the light board 331 is deformed due to thermal expansion and contraction, since the light board framework 400 is made of elastic material, the stress generated by the deformation of the light board 331 can be effectively absorbed into the light board framework 400 and transformed into elasticity, thereby effectively preventing the light board 331 from being broken. Moreover, after the light board 331 is deformed and displaced, the light board 331 can be returned to its original position through elastic recovery of the light board framework 400.

As shown in FIG. 4, the bottom of the mounting groove 410 is provided with a heat dissipation hole 430, and the area of the heat dissipation hole 430 is smaller than the area of the bottom of the mounting groove 410. The position of the light board 331 corresponding to the heat dissipation hole 430 is provided with a thermally conductive adhesive, and the thermally conductive adhesive is bonded to the backplate 320 and the light board 331.

Only one heat dissipation hole 430 may be provided. When there is only one heat dissipation hole 430, the distance from the edge of the heat dissipation hole 430 to the branch portion can just be used for setting glue, and the shape of the heat dissipation hole 430 and the shape of the heat dissipation hole 430 is the same as that of the bottom of the mounting groove 410 and they are coaxial.

In this way, when the light board 331 needs to be reworked and disassembled, the light board 331 and the light board framework 400 can be removed from the backplate first, and then the glue between the light board 331 and the light board framework 400 can be cut off through the heat dissipation hole 430, and the light board 331 can be easily removed, so that it is not easy to cause the light board 331 to be broken when it is reworked and disassembled. Of course, multiple heat dissipation holes 430 can also be provided in each of the plurality of mounting groove.

The light board framework 400 also includes a support post 440. The support post 440 is disposed on the branch portion 413 and is located between two adjacent light supplementation beads 600. The optical film 310 is disposed on a side of the support post 440 away from the branch portion 413. In this way, the support post 440 does not need to be provided on the light board 331, which simplifies the structure of the light board 331 and improves the manufacturing yield of the light boards 331.

Moreover, as shown in FIG. 3, the present application can also be provided with a framework sunken groove 321 at the position on the backplate 320 corresponding to the light board framework 400. The framework sunken groove 321 corresponds to the shape of the light board framework 400, and the light board framework 400 is set in the framework sunken groove 321, so that the light board 331 can directly contact the backplate 320 through the heat dissipation holes 430, and the heat emitted by the light board 331 can be directly transferred to the backplate 320 to dissipate heat from the light board 331. Compared with the solution of providing heat-conducting adhesive, the solution of directly contacting the light board 331 with the back plate 320 through the support sink groove 321 is more economical and practical for heat dissipation.

In this embodiment, a first contact 510 is also arranged on the bottom plate 411. The first contact 510 is electrically connected to the adjacent light supplementation bead 600. The back of the light board 331 is provided with a second contact corresponding to the position of the first contact 510, and the second contact is electrically connected to the same driver as the light beads on the light board 331.

After the light board 331 is installed on the light board framework 400, the second contact on the light board 331 will be electrically connected to the first contact 510 on the light board framework 400, so that the light beads on the light board 331 and the light supplementation beads 600 on the light board framework 400 work synchronously. This makes the light transition between adjacent light boards 331 more uniform, and there is no problem that the light of the light supplementation beads 600 is darker or brighter than the light beads on the light board 331.

Embodiment 2

Figure 8:
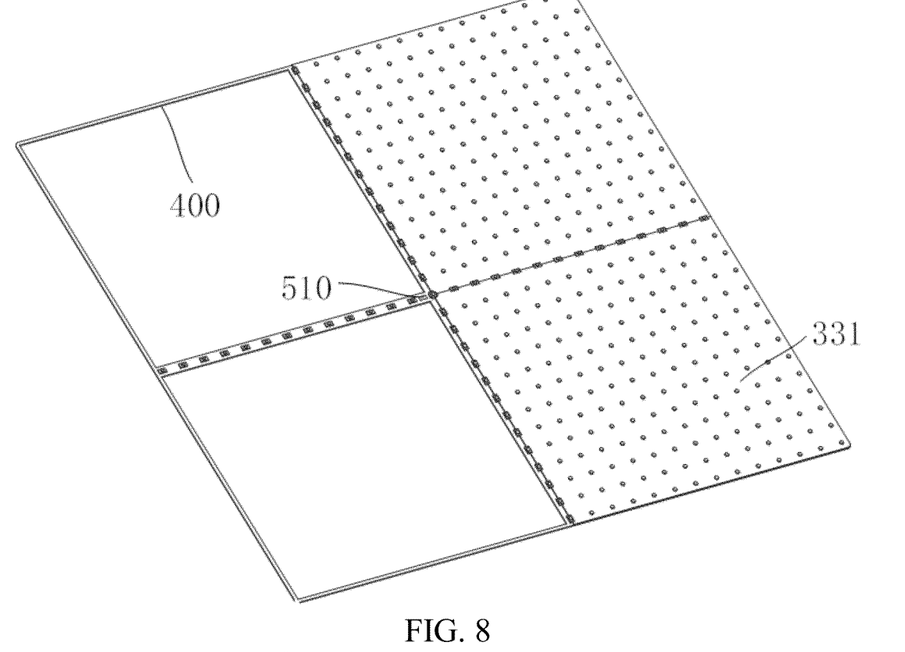
FIG. 8 is a schematic diagram of a backlight module according to a second embodiment of the present application.

As shown in FIG. 8, as the second embodiment of the present application, a backlight module 30 is disclosed. The difference from Embodiment 1 is that the light board framework 400 in the backlight module 30 of this embodiment includes a bottom plate 411 and a plurality of light bead seats. The light bead seats are arranged on the bottom plate 411. The bottom plate 411 and the light bead seats are integrally formed.

The plurality of the light bead seats are arranged in a strip shape to form a limit band, and the plurality of the limit bands are arranged as intersecting horizontal and vertical lines to form the plurality of the mounting grooves 410 distributed in a network pattern. A clamping groove 332 is defined in the edge of the light board 331 corresponding to the position of the light bead seat. The light supplementation beads 600 are arranged on the light bead seat. The light board 331 is arranged on the bottom plate 411. The clamping groove 332 of the light board 331 is engaged with the light bead seat.

When the light board 331 continues operating, heat will cause the viscosity of the glue between the light board 331 and the light board framework 400 to deteriorate. The clamping groove 332 on the edge of the light board 331 is engaged with the light bead seat to limit the position of the light board 331 and effectively prevent the displacement of the light board 331.

Moreover, compared with the first embodiment, the light board framework 400 in this embodiment can make the distance between the light supplementation bead 600 and the light board 331 on the light board 331 be equal to the distance from the adjacent light bead on the light board 331, thus improving the uniformity of surface light emission of the assembled light board 330.

The height of the light bead seat in this embodiment is the same as the thickness of the light board 331, and the light supplementation bead 600 is located on the same plane as the light board 331 on the light board 331, so that he uniformity of surface light emission of the assembled light board 330 is further improved.

Figure 9:
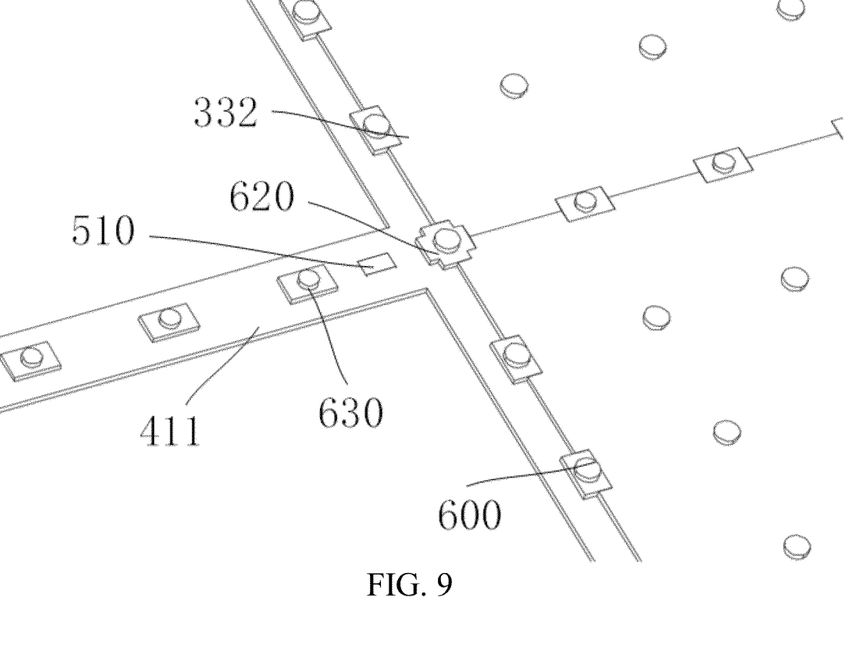
FIG. 9 is a partially enlarged schematic view of FIG. 8 of the present application.

As shown in FIG. 9, the shape of the clamping groove 332 of the light board 331 is adapted to the shape of the light bead seat. The light bead seat includes a first seat 620 and a second seat 630. The first seat 620 is located at the intersection of the two intersecting limiting bands. The four corners of the first seat 620 are respectively provided with notches, forming a cross-shaped structure. The corner of the light board 331 corresponds to the notch of the first seat 620.

The position of the second seat 630 corresponds to the side of the light board 331, and the shape of the second seat 630 is rectangular.

To put it simply, for example, when the number of light boards 331 in the assembled light board 330 is four, and the four light boards 331 are arranged in the shape of a Chinese character "|||", then the corresponding shape of the light bead seat arranged at the central position of the four light boards 331 is a cross-shaped structure, whereby the four light boards 331 are limited at the same time.

It should be noted that the inventive concept of the present application can be formed into many embodiments, but the length of the application document is limited and so these embodiments cannot be enumerated one by one. The technical features can be arbitrarily combined to form a new embodiment, and the original technical effect may be enhanced after the various embodiments or technical features are combined.

The foregoing description is merely a further detailed description of the present application made with reference to some specific illustrative embodiments, and the specific implementations of the present application will not be construed to be limited to these illustrative embodiments. For those having ordinary skill in the technical field to which this application pertains, numerous simple deductions or substitutions may be made without departing from the concept of this application, which shall all be regarded as falling in the scope of protection of this application.

What is claimed is:

1. A backlight module, comprising a backplate, a light board framework, and an assembled light board that are arranged in sequence, wherein the assembled light board comprises a plurality of light boards, and wherein a seam is formed between every two adjacent light boards, wherein the light board framework is arranged on the backplate and comprises:

a framework main body, comprising a plurality of mounting grooves, wherein a number of the plurality of mounting grooves is equal to a number of the plurality of light boards in the assembled light board, and wherein the plurality of light boards are arranged in the plurality of mounting grooves in one-to-one correspondence; and a plurality of light supplementation beads, disposed between every two adjacent mounting grooves and configured to supplement light to the seam between every two adjacent light boards;

wherein the light board framework comprises a bottom plate and a plurality of light bead seats arranged on the bottom plate, wherein the plurality of light bead seats are arranged in strips to form a plurality of limiting bands, and wherein the plurality of limiting bands are arranged as intersecting horizontal and vertical lines to define the plurality of mounting grooves distributed in the network;

wherein an edge of each of the plurality of light boards comprises a clamping groove corresponding to a position of the respective light bead seat, wherein the plurality of light supplementation beads are each arranged on the respective light bead seat, wherein each of the plurality of light boards is arranged on the bottom plate, and wherein the clamping groove of each of the plurality of light boards is engaged with the respective light bead seat.

2. The backlight module as recited in claim 1, wherein a bottom of each of the plurality of mounting grooves comprises at least one heat dissipation hole, and wherein an area of the at least one heat dissipation hole is less than an area of the bottom of the respective mounting groove;

wherein a thermally conductive adhesive is disposed at a position of each of the plurality of light boards corresponding to the respective heat dissipation hole, and wherein the thermally conductive adhesive is bonded to both the backplate and the respective light board.

3. The backlight module as recited in claim 1, wherein a first contact is arranged on the bottom plate and is electrically connected to the adjacent light supplementation bead;

wherein a second contact is provided at a position corresponding to the first contact on a back of the respective light board, and wherein the second contact is electrically connected to a same driver as the plurality of light beads on the respective light board.

4. The backlight module as recited in claim 1, wherein the shape of the clamping groove of each of the plurality of light boards matches the shape of the light bead seat, and the light bead seat includes a first seat and a second seat, wherein the first seat is disposed at an intersection of every two interlaced limiting bands, wherein four corners of the first seat each define a notch thus forming a cross-shaped structure, and wherein a corner of each light board is arranged corresponding to the corresponding notch of the respective first seat;

wherein the second seat corresponds to a side of the respective light board, and has a rectangular shape.

5. The backlight module as recited in claim 1, wherein the bottom plate is integrally formed with the plurality of light bead seats.

6. The backlight module as recited in claim 1, wherein the plurality of light supplementation beads are located on a same plane as the plurality of light beads disposed on each of the plurality of light boards.

7. The backlight module as recited in claim 2, wherein there are defined a plurality of heat dissipation holes in each of the plurality of mounting grooves.

8. The backlight module as recited in claim 2, wherein there is defined a framework sunken groove in the backplate at a position of the backplate corresponding to the light board framework, wherein a shape of the framework sunken groove is consistent with a shape of the light board framework, and wherein the light board framework is arranged in the framework sunken groove.

9. The backlight module as recited in claim 1, wherein the backlight module further comprises an optical film arranged on a side of the assembled light board facing away from the backplate.

10. The backlight module as recited in claim 1, wherein the plurality of light boards are fixed in the plurality of mounting grooves by glue, and wherein the light board framework is fixed to the backplate by glue or screws.

11. A display device, comprising a display panel and a backlight module, wherein the backlight module is arranged opposite to the display panel and configured to provide a light source for the display panel; wherein the backlight module comprises a backplate, a light board framework, and an assembled light board that are arranged in sequence, wherein the assembled light board comprises a plurality of light boards, and wherein a seam is formed between every two adjacent light boards, wherein the light board framework is arranged on the backplate and comprises:

a framework main body, comprising a plurality of mounting grooves, wherein a number of the plurality of mounting grooves is equal to a number of the plurality of light boards in the assembled light board, and wherein the plurality of light boards are arranged in the plurality of mounting grooves in one-to-one correspondence; and a plurality of light supplementation beads, disposed between every two adjacent mounting grooves and configured to supplement light to the seam between every two adjacent light boards;

wherein the light board framework comprises a bottom plate and a plurality of light bead seats arranged on the bottom plate, wherein the plurality of light bead seats are arranged in strips to form a plurality of limiting bands, and wherein the plurality of limiting bands are arranged as intersecting horizontal and vertical lines to define the plurality of mounting grooves distributed in the network;

wherein an edge of each of the plurality of light boards comprises a clamping groove corresponding to a position of the respective light bead seat, wherein the plurality of light supplementation beads are each arranged on the respective light bead seat, wherein each of the plurality of light boards is arranged on the bottom plate, and wherein the clamping groove of each of the plurality of light boards is engaged with the respective light bead seat.

* * * * *

UNITED STATES PATENT AND TRADEMARK OFFICE
CERTIFICATE OF CORRECTION

| | | |
|---|---|---|
| PATENT NO. | : 11,871,518 B1 | Page 1 of 1 |
| APPLICATION NO. | : 18/211524 | |
| DATED | : January 9, 2024 | |
| INVENTOR(S) | : Jiang He et al. | |

It is certified that error appears in the above-identified patent and that said Letters Patent is hereby corrected as shown below:

On the Title Page

Column 1, Foreign Application Priority Data field, insert --September 08, 2022 (CN) 202211092563.9--.

Signed and Sealed this
Twentieth Day of February, 2024

Katherine Kelly Vidal
*Director of the United States Patent and Trademark Office*